United States Patent
Watanabe

(10) Patent No.: US 6,325,848 B1
(45) Date of Patent: Dec. 4, 2001

(54) METHOD OF MAKING A SILICON SUBSTRATE WITH CONTROLLED IMPURITY CONCENTRATION

(75) Inventor: Masahito Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/190,825

(22) Filed: Nov. 12, 1998

(30) Foreign Application Priority Data

Nov. 11, 1997 (JP) .................................................. 9-308873

(51) Int. Cl.[7] .................................................. C30B 1/00
(52) U.S. Cl. .................................. 117/2; 117/20; 117/54; 117/84; 117/88; 117/935; 438/471
(58) Field of Search .................................. 117/54, 84, 88, 117/935, 2, 20; 438/471

(56) References Cited

U.S. PATENT DOCUMENTS

| | | | |
|---|---|---|---|
| 5,436,176 | * | 7/1995 | Shinizu et al. ........................ 438/256 |
| 5,953,582 | * | 9/1999 | Yudasaka et al. ...................... 438/29 |
| 6,111,260 | * | 9/1999 | Dawson et al. .................. 250/492.21 |

FOREIGN PATENT DOCUMENTS

| | | | |
|---|---|---|---|
| 56-81928 | | 7/1981 | (JP) . |
| 5814538 | | 1/1983 | (JP) . |
| 6089931 | | 5/1985 | (JP) . |
| 363 182815A | * | 7/1988 | (JP) .............................. H01L/21/205 |
| 404 124094A | * | 7/1988 | (JP) .............................. C30B/29/06 |
| 7326622 | | 12/1995 | (JP) . |
| 8162462 | | 6/1996 | (JP) . |
| 8250504 | | 9/1996 | (JP) . |
| 8274104 | | 10/1996 | (JP) . |
| 9148335 | | 6/1997 | (JP) . |
| 9283529 | | 10/1997 | (JP) . |

* cited by examiner

Primary Examiner—Robert Kunemund
(74) Attorney, Agent, or Firm—Young & Thompson

(57) ABSTRACT

A single-crystal silicon substrate is provided, which makes it possible to accurately control the concentration and profile of an introduced impurity. This silicon substrate is comprised of a single-crystal Si base layer and a single-crystal Si low oxygen-concentration layer formed on the base layer. The base layer has a first oxygen concentration and the low oxygen-concentration layer has a second oxygen concentration lower than the first oxygen concentration. This silicon substrate is fabricated by (a) growing a single-crystal Si epitaxial layer on the main surface of a single-crystal Si base material in such a way that the epitaxial layer has a second oxygen concentration lower than of the first oxygen concentration, or (b) heat-treating a single-crystal Si base material to cause outward diffusion of oxygen existing in the base material through the main surface thereof, thereby forming a low oxygen-concentration layer extending along the main surface of the base material in the base material. The remaining base material serves as a single-crystal Si base layer having the first oxygen concentration. The lower oxygen concentration layer has a second oxygen concentration lower than the first oxygen concentration.

7 Claims, 14 Drawing Sheets

METHOD OF MAKING A SILICON SUBSTRATE WITH CONTROLLED IMPURITY CONCENTRATION

BACKGROUND OF THE INVENTION

1. Field of the Invention

The present invention relates to a semiconductor substrate and a fabrication method thereof and more particularly, to a single-crystal silicon (Si) substrate having a low oxygen-concentration layer and a fabrication method of the substrate.

2. Description of the Prior Art

In recent years, integration and miniaturization of the semiconductor integrated circuit devices (ICs) using a single-crystal Si substrate have been progressing more and more. Under such the circumstances, the need to accurately control the concentration and profile of impurity-doped regions such as well regions and source/drain regions has been becoming stronger and stronger.

On the other hand, the impurity-doped regions have been usually formed by an ion-implantation process.

To accurately control the concentration and profile of the impurity-doped regions, the dopant atoms introduced into the Si substrate by the ion-implantation process are required not to cause unwanted diffusion in subsequent fabrication processes for the ICs.

It is popular that the dopant atoms introduced by the ion-implantation process are electrically inactive. Therefore, to make the ion-implanted substrate suitable for the ICs, the dopant atoms usually need to be electrically activated by a heat-treatment or rapid annealing process.

To make it sure that the introduced dopant atoms are electrically activated, the heat-treatment or annealing process has been typically performed at a temperature as high as 800° C. or higher for a short time (e.g., several seconds) or at a temperature as high as approximately 700° C. for a long time (e.g., several minutes).

However, if the annealing process is performed at 800° C. or higher, there is a problem that the introduced dopant atoms tend to diffuse in the substrate, resulting in unwanted change of the concentration and profile of the impurity-doped region. On the other hand, if the annealing process is performed at 700° C. or lower, there is a problem that the annealing process necessitates a long processing time and as a result, this annealing process is not practical for actual IC fabrication.

Moreover, there is another problem that the substrate tends to be contaminated during the annealing process due to the long processing time.

SUMMARY OF THE INVENTION

Accordingly, an object of the present invention is to provide a single-crystal Si substrate that makes it possible to electrically activate an introduced impurity by an annealing process at a temperature lower than 700° C. for a short time, and a fabrication method of the substrate.

Another object of the present invention is to provide a single-crystal Si substrate that makes it possible to accurately control the concentration and profile of an introduced impurity by an ion-implantation process, and a fabrication method of the substrate.

Still another object of the present invention is to provide a single-crystal Si substrate that is difficult to be contaminated during an annealing process for an introduced impurity by an ion-implantation process.

The above objects together with others not specifically mentioned will become clear to those skilled in the art from the following description.

According to a first aspect of the present invention, a silicon substrate is provided, which is comprised of a single-crystal Si base layer and a single-crystal Si low oxygen-concentration layer formed on the base layer. The base layer has a first oxygen concentration and the low oxygen-concentration layer has a second oxygen concentration lower than the first oxygen concentration.

According to a second aspect of the present invention, a fabrication method of the silicon substrate according to the first aspect is provided, which is comprised of the following steps (a) and (b).

(a) A single-crystal Si base material with a flat main surface is prepared. The base material has a first oxygen concentration.

(b) A single-crystal Si epitaxial layer is grown on the main surface of the base material in such a way that the epitaxial layer has a second oxygen concentration lower than the first oxygen concentration.

According to a third aspect of the present invention, another fabrication method of the silicon substrate according to the first aspect is provided, which is comprised of the following steps (a') and (b').

(a') A single-crystal Si base material with a flat main surface is prepared. The base material has a first oxygen concentration. This is the same as the above step (a).

(b') The base material is heat-treated to cause outward diffusion of oxygen existing in the base material through the main surface of the base material, thereby forming a low oxygen-concentration layer extending along the main surface of the base material in the base material. The remaining base material serves as a single-crystal Si base layer having the first oxygen concentration. The low oxygen-concentration layer has a second oxygen concentration lower than the first oxygen concentration.

DETAILED DESCRIPTION OF THE INVENTION

As described above, the silicon substrate according to the first aspect of the present invention is comprised of a single-crystal Si base layer and a single-crystal Si low oxygen-concentration layer formed on the base layer. The base layer has a first oxygen concentration and the low oxygen-concentration layer has a second oxygen concentration lower than the first oxygen concentration.

With the silicon substrate according to the first aspect of the present invention, the low oxygen-concentration layer whose oxygen concentration is lower than that of the base layer is formed on the base layer. Therefore, when an impurity is introduced into the low oxygen-concentration layer by an ion-implantation process in order to selectively change the electrical conductivity of the low oxygen-concentration layer, and then, the substrate is subjected to an annealing or heat-treatment process to electrically activate the introduced impurity, crystal defects existing in the low oxygen-concentration layer (which are induced by the ion-implantation process) are readily repaired.

As a result, the annealing or heat-treatment process is able to be performed at a temperature lower than 700° C. for a short time. This temperature lowering of the annealing or heat-treatment process leads to decrease of a diffusion length of the introduced impurity in the low oxygen-concentration layer. Accordingly, the concentration and profile of the introduced impurity into the low oxygen-concentration layer is able to be controlled accurately.

The mechanism of the impurity diffusion during the annealing process is not yet understood. However, it is assumed that the diffusion rate of the introduced impurity is lowered with the decreasing oxygen concentration, because the diffusion rate of crystal defects induced by the ion-implantation process is increased and the crystal defects tend to be restored or eliminated even at a low annealing temperature.

In a preferred embodiment of the silicon substrate according to the first aspect of the present invention, the second oxygen concentration of the low oxygen-concentration layer is equal to $1 \times 10^{17}$ atoms/cm$^3$ or lower. This is due to the following reason:

In a typical single-crystal Si ingot fabricated according to the well-known Czochralski (CZ) method, the first oxygen concentration of the single-crystal Si base layer is usually equal to approximately $0.8 \times 10^{18}$ atoms/cm$^3$ to $2.0 \times 10^{18}$ atoms/cm$^3$. Therefore, if the second oxygen concentration of the lower oxygen-concentration layer is equal to $1 \times 10^{17}$ atoms/cm$^3$ or lower (which is low enough with respect to the first oxygen concentration), the advantage of the present invention is ensured.

In another preferred embodiment of the substrate according to the first aspect of the present invention, the low oxygen-concentration layer has a thickness ranging from 5 $\mu$m to 20 $\mu$m. If the low oxygen-concentration layer has a thickness less than 5 $\mu$m, oxygen (O) atoms existing in the base layer tend to diffuse into the low oxygen-concentration layer. As a consequence, the low oxygen-concentration layer is unable to be formed as desired. If the low oxygen-concentration layer has a thickness greater than 20 $\mu$m, the mechanical strength of the substrate itself tends to degrade. Also, no low oxygen-concentration layer with a thickness greater than 20 $\mu$m, into which a suitable impurity or impurities is/are doped, is necessary for fabricating typical ICs.

The silicon substrate according to the first aspect of the present invention is fabricated by the method according to the second aspect of the present invention, which comprises the steps (a) and (b).

In the step (a), a single-crystal Si base material with a flat main surface is prepared. The base material has a first oxygen concentration.

In the step (b), a single-crystal Si epitaxial layer is grown on the main surface of the base material in such a way that the epitaxial layer has a second oxygen concentration lower than the first oxygen concentration.

With the fabrication method according to the second aspect of the present invention, the single-crystal Si epitaxial layer is grown on the main surface of the single-crystal Si base material in such a way that the epitaxial layer has the second oxygen concentration lower than the first oxygen concentration of the base material. Therefore, the epitaxial layer and the base material serve as the low oxygen-concentration layer and the base layer of the silicon substrate according to the first aspect of the present invention, respectively.

Thus, the silicon substrate according to the first aspect of the present invention is fabricated.

As known well, in the Czochralski method, unwanted oxygen is unavoidably introduced into a resultant single-crystal Si ingot from a fused-silica (SiO$_2$) crucible for storing a melted Si during the growth process. On the other hand, in the epitaxial growth process in the step (b), no oxygen source is used. Thus, the oxygen concentration of the epitaxial layer becomes lower than that of the base material.

In a preferred embodiment of the fabrication method according to the second aspect of the present invention, the second oxygen concentration of the low oxygen-concentration layer is equal to $1 \times 10^{17}$ atoms/cm$^3$ or lower. The reason is the same as that described in the silicon substrate according to the first aspect of the present invention.

In another preferred embodiment of the method according to the second aspect of the present invention, the low oxygen-concentration layer has a thickness ranging from 5 $\mu$m to 20 $\mu$m. The reason is the same as that described in the silicon substrate according to the first aspect of the present invention.

The epitaxial growth process for the step (b) may be performed under any condition if the oxygen concentration of a resultant epitaxial layer is lower than that of the base material. To prevent the oxygen existing in the base material from diffusing into the epitaxial layer in the step (b), it is preferred that the growth temperature is set as 1000° C. or lower.

Moreover, the silicon substrate according to the first aspect of the present invention may be fabricated by the method according to the third aspect of the present invention, which comprises the steps (a') and (b').

In the step (a'), a single-crystal Si base material with a flat main surface is prepared. The base material has a first oxygen concentration. This is the same as the above step (a).

In the step (b'), the base material is heat-treated to cause outward diffusion of oxygen contained in the base material through the main surface of the base material, thereby forming a low oxygen-concentration layer extending along the main surface of the base material in the base material. The remaining base material serves as a single-crystal Si base layer having the first oxygen concentration. The low oxygen-concentration layer has a second oxygen concentration lower than the first oxygen concentration.

With the fabrication method of a silicon substrate according to the third aspect of the present invention, the low oxygen-concentration layer, which has the second oxygen concentration lower than the first oxygen concentration of the base material, is formed in the single-crystal Si base material to extend along the main surface of the base material. The remaining base material serves as the single-crystal Si base layer having the first oxygen concentration.

Therefore, the low oxygen-concentration layer and the base layer serve as the low oxygen-concentration layer and the base layer of the silicon substrate according to the first aspect of the present invention, respectively.

Thus, the silicon substrate according to the first aspect of the present invention is fabricated.

In a preferred embodiment of the fabrication method according to the third aspect of the present invention, the second oxygen concentration of the low oxygen-concentration layer is equal to $1 \times 10^{17}$ atoms/cm$^3$ or lower. The reason is the same as that described in the silicon substrate according to the first aspect of the present invention.

In another preferred embodiment of the method according to the third aspect of the present invention, the low oxygen-concentration layer has a thickness ranging from 5 $\mu$m to 20 $\mu$m. The reason is the same as that described in the silicon substrate according to the first aspect of the present invention.

The heat treatment process for the step (b') may be performed under any condition if the oxygen concentration of a resultant low oxygen-concentrated layer is lower than that of the base material. To make is sure to diffuse oxygen existing in the base material outward in the step (b'), it is preferred that the base material is exposed to an atmosphere at a temperature that allow the oxygen to vaporize and diffuse outward.

For example, a hydrogen ($H_2$), nitrogen ($N_2$), or argon (Ar) atmosphere is preferably used as the atmosphere in the step (b'). Also, a temperature of 1100° C. or higher and a heat-treatment period of 8 hours or longer are preferably used for the step (b').

In the heat treatment process in the step (b'), outward diffusion of the unwanted oxygen existing in the base material is caused through the main surface of the base material. Therefore, the low oxygen-concentration layer whose oxygen concentration is lower than that of the base material is formed to extend along the main surface of the base material.

Additionally, in the present invention, it is preferred that the single-crystal Si base material is produced from a single-crystal Si ingot grown according to the Czochralski method. This is because an obtainable size or diameter of a single-crystal Si ingot grown according to the Czochralski method is large enough (e.g., 300 mm) for fabricating the recent or future ICs.

However, a single-crystal Si ingot grown according to any other method than the Czochralski method (e.g., the Bridgman method) if the oxygen concentration of the low oxygen-concentration layer is able to be lower than that of the base layer.

BRIEF DESCRIPTION OF THE DRAWINGS

In order that the present invention may be readily carried into effect, it will now be described with reference to the accompanying drawings.

EXAMPLES

Figure 1A:
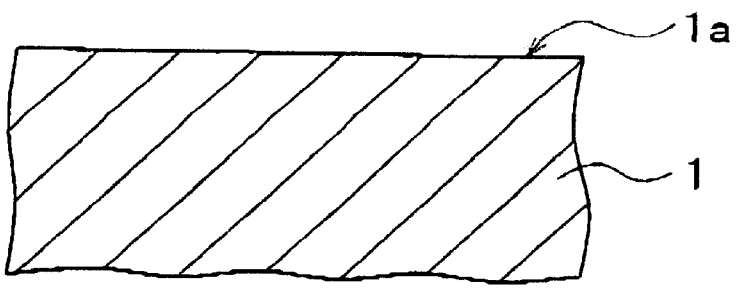
FIGS. 1A to 1D are partial, schematic cross-sectional views showing a fabrication method of a Si substrate according to the present invention, respectively, to which ion-implantation and annealing processes are added.

Preferred examples of the present invention and a comparative example will be described in detail below while referring to the drawings attached.

First Example

A single-crystal Si substrate according to the present invention was fabricated in the following way.

First, as shown in FIG. 1A, a single-crystal Si base material 1 with a plate-like shape was prepared from a single-crystal Si ingot grown according to the Czochralski method. The Si base material 1 had a flat main surface 1a on its top.

At this stage, the oxygen concentration of the base material 1 was measured by the use of a Secondary-Ion Mass Spectrometer (SIMS). As a result, it was found that the base material 1 had an oxygen concentration of $1.2 \times 10^{18}$ atoms/$cm^3$ over the whole base material 1.

Figure 1B:
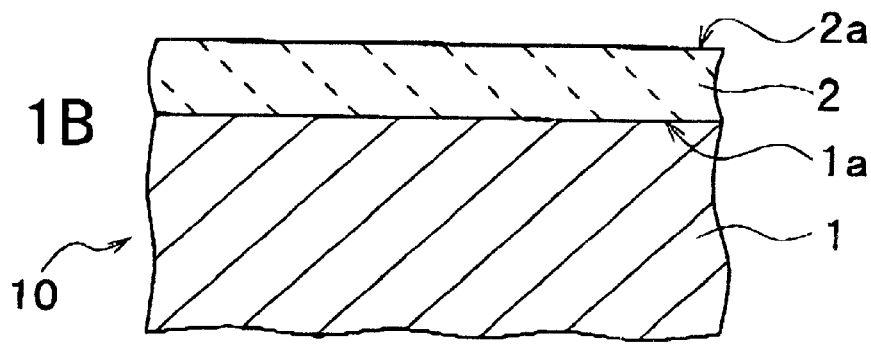

Next, as shown in FIG. 1B, a single-crystal Si epitaxial layer 2 with a thickness of 5 µm was grown on the main surface 1a of the single-crystal Si base material 1 by a Vapor Phase Epitaxial (VPE) method under the condition that silicon tetrachloride ($SiCl_4$) was used as a source material for Si and the growth temperature was set as 900° C. Dichlorosilane ($SiH_2Cl_2$) may be used instead of $SiH_4$. The epitaxial layer 2 had a flat surface 2a.

Thus, a single-crystal Si substrate 10 according to the present invention, which is comprised of the single-crystal Si base material 1 and the single-crystal Si epitaxial layer 2, was fabricated.

The oxygen concentration of the epitaxial layer 2 was measured by the use of a SIMS. As a result, it was found that the epitaxial layer 2 had an oxygen concentration of $2\times10^{16}$ atoms/cm$^3$, which was equal to one-sixth (⅙) of that of the base material 1.

Figure 3:
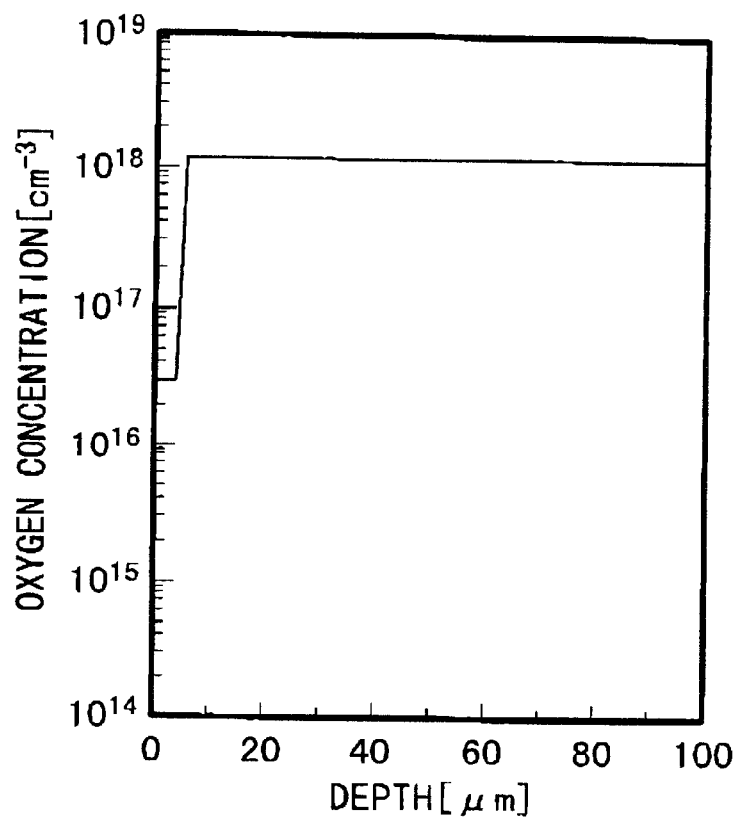
FIG. 3 is a graph showing the oxygen concentration distribution of the substrate according to a first example of the present invention as a function of the depth from the main surface of the substrate.

It was also found that the substrate 10 has an oxygen distribution show in FIG. 3. As seen from FIG. 3, the oxygen concentration was $2\times10^{16}$ atoms/cm$^3$ at a depth of 5 μm or less from the surface 2a of the epitaxial layer 2, and it was abruptly raised to $1.2\times10^{17}$ atoms/cm$^3$ at the depth greater than 5 μm.

Figure 1C:
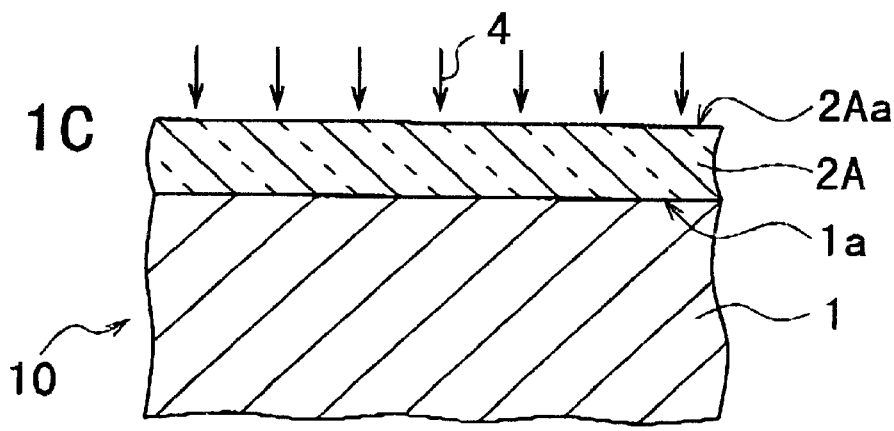

Subsequently, to confirm the advantage of the present invention, as shown in FIG. 1C, phosphorus ions (P$^+$) 4 as an n-type impurity were implanted into the single-crystal Si epitaxial layer 2 of the substrate 10 according to the present invention at an acceleration energy of 1 MeV with a dose of $2\times10^{15}$ atoms/cm$^2$, thereby forming a phosphorus-doped epitaxial layer 2A. Thus, ion-implantation condition was for forming n-type well regions. The phosphorus-implanted epitaxial layer 2 had a flat surface 2Aa.

Figure 8:
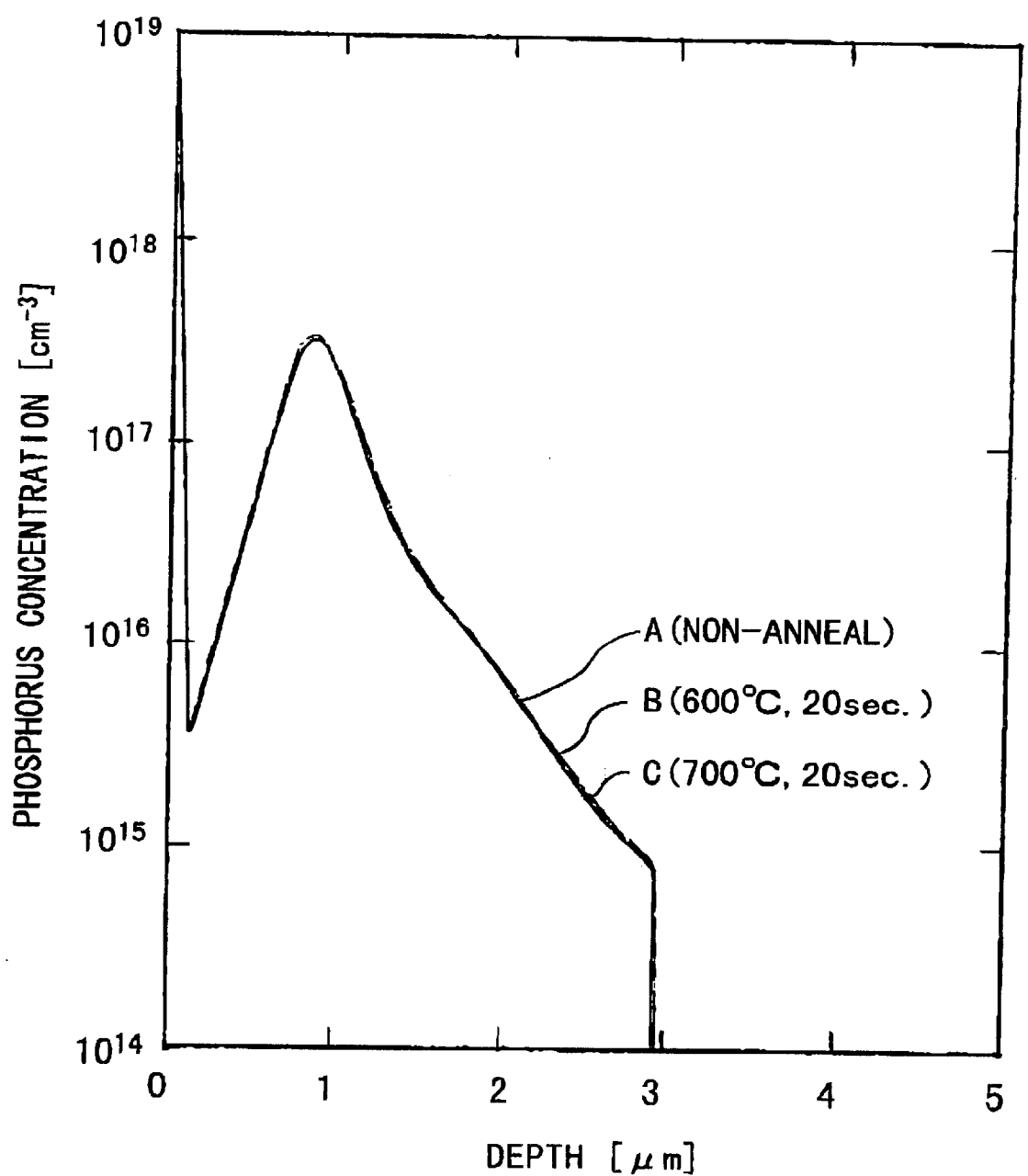
FIG. 8 is a graph showing the implanted-phosphorus concentration distribution and its change of the substrate according to the first example of the present invention as a function of the depth from the main surface of the substrate.

Then, the phosphorus distribution of the phosphorus-doped epitaxial layer 2A was measured by the use of a SIMS. As a result, it was found that the epitaxial layer 2 had a phosphorus distribution shown by the curve A in FIG. 8. As seen from FIG. 8, the ion-implanted region of the epitaxial layer 2 has the maximum depth of approximately 3 μm from the surface 2Aa of the phosphorus-doped epitaxial layer 2A.

Figure 1D:
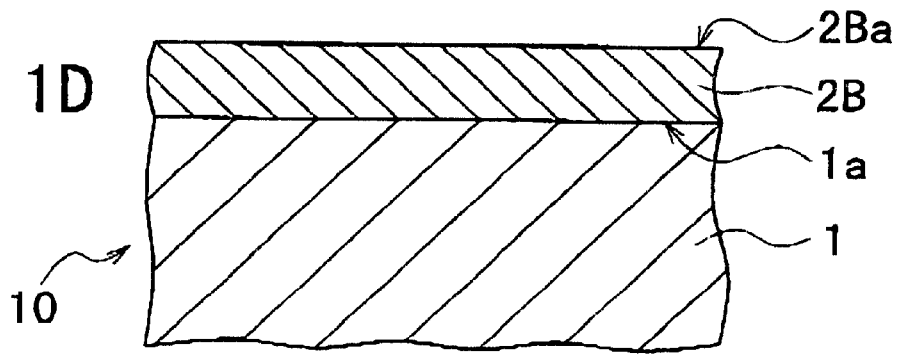

Finally, to electrically activate the implanted phosphorus and annealing the phosphorus-implanted part of the epitaxial layer 2A, the substrate 10 was subjected to a heat-treatment or annealing process at a temperature of 600 or 700° C. for 10, 20, or 30 seconds, as shown in FIG. 1D. The reference characters 2B and 2Ba in FIG. 1D denote the annealed and phosphorus-implanted epitaxial layer 2A and the surface of the layer 2B, respectively.

Then, the phosphorus distribution of the annealed and phosphorus-doped epitaxial layer 2B was measured in the same way as above. As a result, it was found that the epitaxial layer 2B had a phosphorus distribution shown by the curve B (600° C., 20 sec) and a phosphorus distribution shown by the curve C (700° C., 20 sec) in FIG. 8, both of which were approximately the same as the curve A. This means that the diffusion length of the implanted phosphorus is satisfactorily short and therefore, the concentration and profile of the implanted phosphorus are not approximately changed.

Further, it was checked whether the implanted phosphorus atoms were electrically activated or not by measuring the spreading resistance of the epitaxial layer 2B. As a result, as shown in Table 1, it was found that the epitaxial layer 2B was completely annealed under all the annealing conditions that the annealing temperature was 600 or 700° C. and the annealing period was 10, 20, or 30 seconds.

TABLE 1

| | ANNEALING CONDITION | | | | | |
| --- | --- | --- | --- | --- | --- | --- |
| | 600° C. | | | 700° C. | | |
| EXAMPLE NO. | 10 sec. | 20 sec. | 30 sec. | 10 sec. | 20 sec. | 30 sec. |
| 1 | ○ | ○ | ○ | ○ | ○ | ○ |
| 2 | ○ | ○ | ○ | ○ | ○ | ○ |
| 3 | ○ | ○ | ○ | ○ | ○ | ○ |
| 4 | ○ | ○ | ○ | ○ | ○ | ○ |
| COMP. | x | x | x | x | ○ | ○ |

In Table 1, the symbol "○" denotes the result that the implanted phosphorus was completely activated (100%), and the symbol "X" denotes the result that the implanted phosphorus was not completely (not 100%) activated.

Second Example

A single-crystal Si substrate according to the present invention was fabricated in the same way as that of the first example except that the single-crystal Si epitaxial layer 2 had a thickness of 10 μm. Then, phosphorus-ion implantation and annealing processes were performed to the substrate 10 in the same way as those of the first example.

As a result, it was found that the base material 1 had an oxygen concentration of $1.2\times10^{17}$ atoms/cm$^3$ and the epitaxial layer 2 had an oxygen concentration of $2\times10^{16}$ atoms/cm$^3$, which was equal to one-sixth (⅙) of that of the base material 1.

Figure 4:
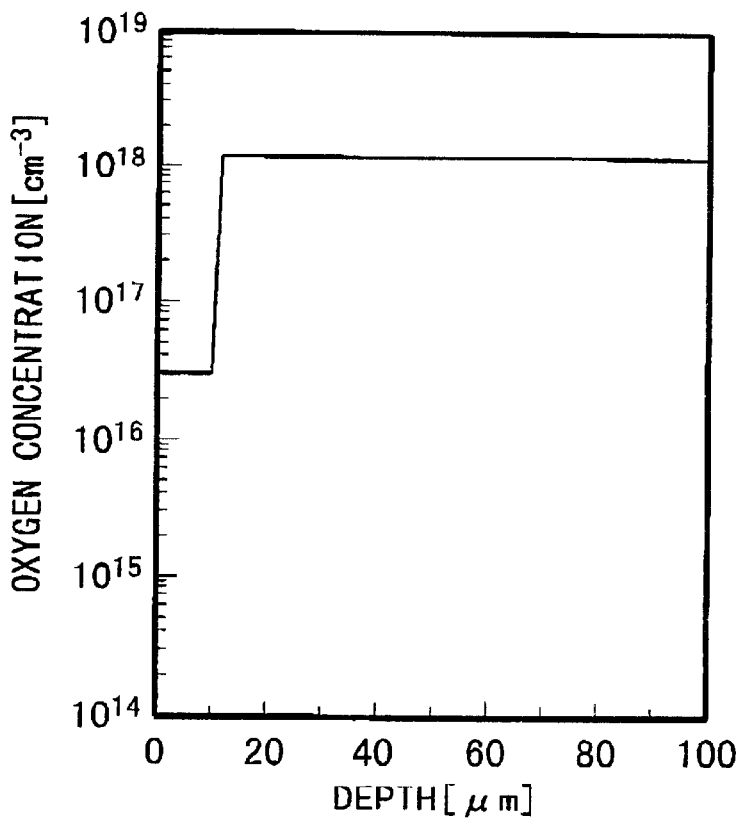
FIG. 4 is a graph showing the oxygen concentration distribution of the substrate according to a second example of the present invention as a function of the depth from the main surface of the substrate.

As seen from FIG. 4, the oxygen concentration was $2\times10^{16}$ atoms/cm$^3$ at a depth of 10 μm or less and it was abruptly raised to $1.2\times10^{17}$ atoms/cm$^3$ at a depth greater than 10 μm.

Figure 9:
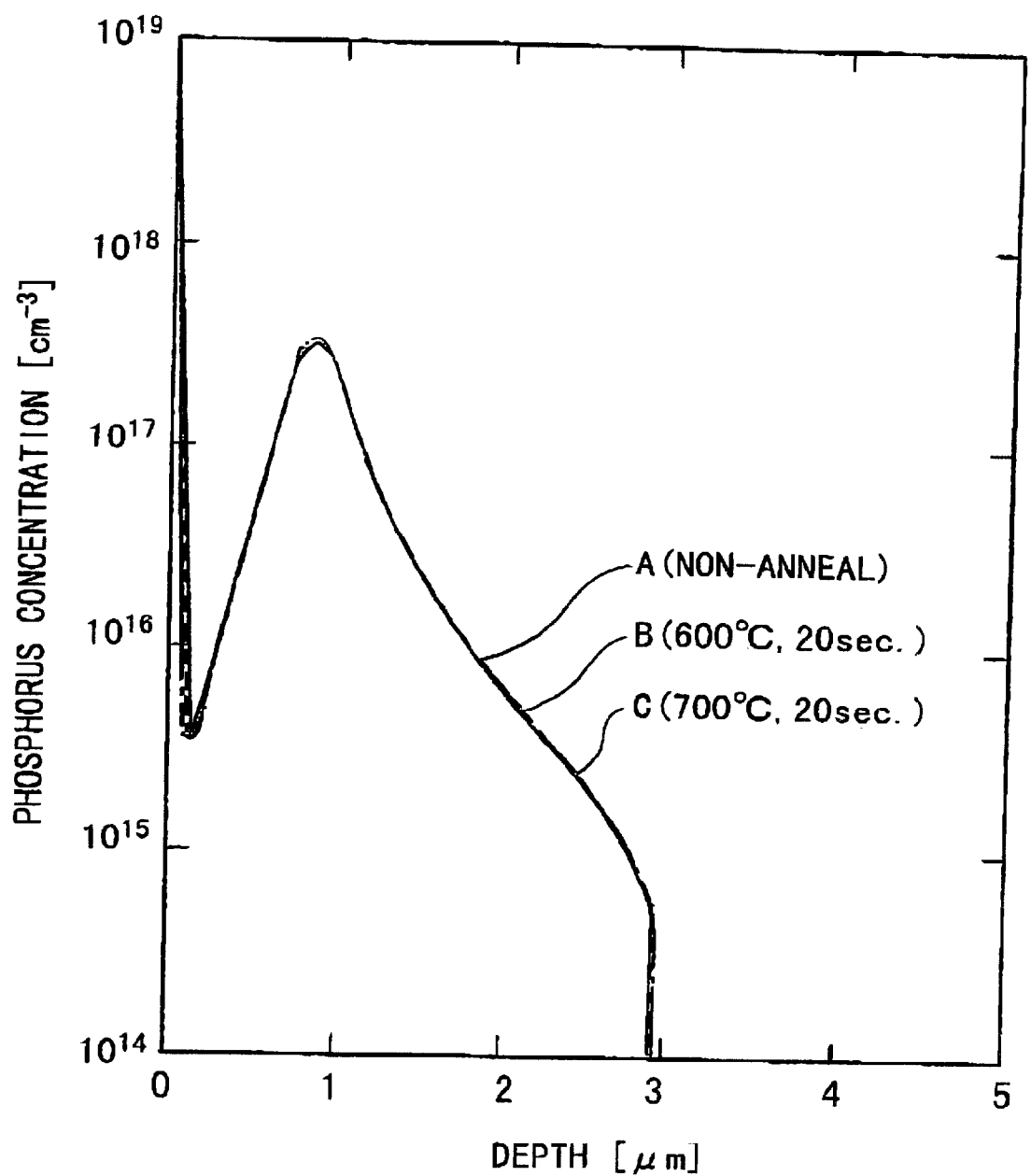
FIG. 9 is a graph showing the implanted-phosphorus concentration distribution and its change of the substrate according to the second example of the present invention as a function of the depth from the main surface of the substrate.

It was found that the epitaxial layer 2A prior to the annealing process had a phosphorus distribution shown by the curve A in FIG. 9. Also, it was found that the epitaxial layer 2B after the annealing process at a temperature of 600° C. for 20 seconds had a phosphorus distribution shown by the curve B in FIG. 9, and that the epitaxial layer 2B after the annealing process at a temperature of 700° C. for 20 seconds had a phosphorus distribution shown by the curve C in FIG. 9, both of which are approximately the same as the curve A in FIG. 9.

Third Example

A single-crystal Si substrate according to the present invention was fabricated in the same way as that of the first example except that the single-crystal Si epitaxial layer 2 had a thickness of 20 μm. Then, phosphorus-ion implantation and annealing processes were performed to the substrate 10 implanted in the same way as those of the first example.

As a result, it was found that the base material 1 had an example concentration of $1.2\times10^{17}$ atoms/cm$^3$ and the epitaxial layer 2 had an oxygen concentration of $2\times10^{16}$ atoms/cm$^3$, which was equal to one-sixth (⅙) of that of the base material 1.

Figure 5:
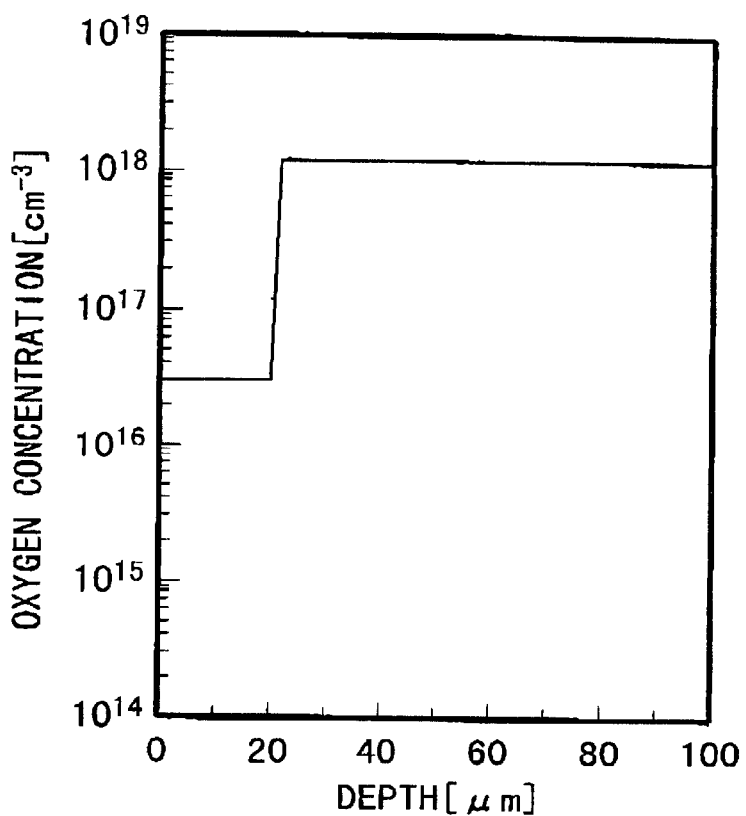
FIG. 5 is a graph showing the oxygen concentration distribution of the substrate according to a third example of the present invention as a function of the depth from the main surface of the substrate.

As seen from FIG. 5, the oxygen concentration was $2\times10^{16}$ atoms/cm$^3$ at a depth of 20 μm or less and it was abruptly raised to $1.2\times10^{17}$ atoms/cm$^3$ at a depth greater than 20 μm.

Figure 10:
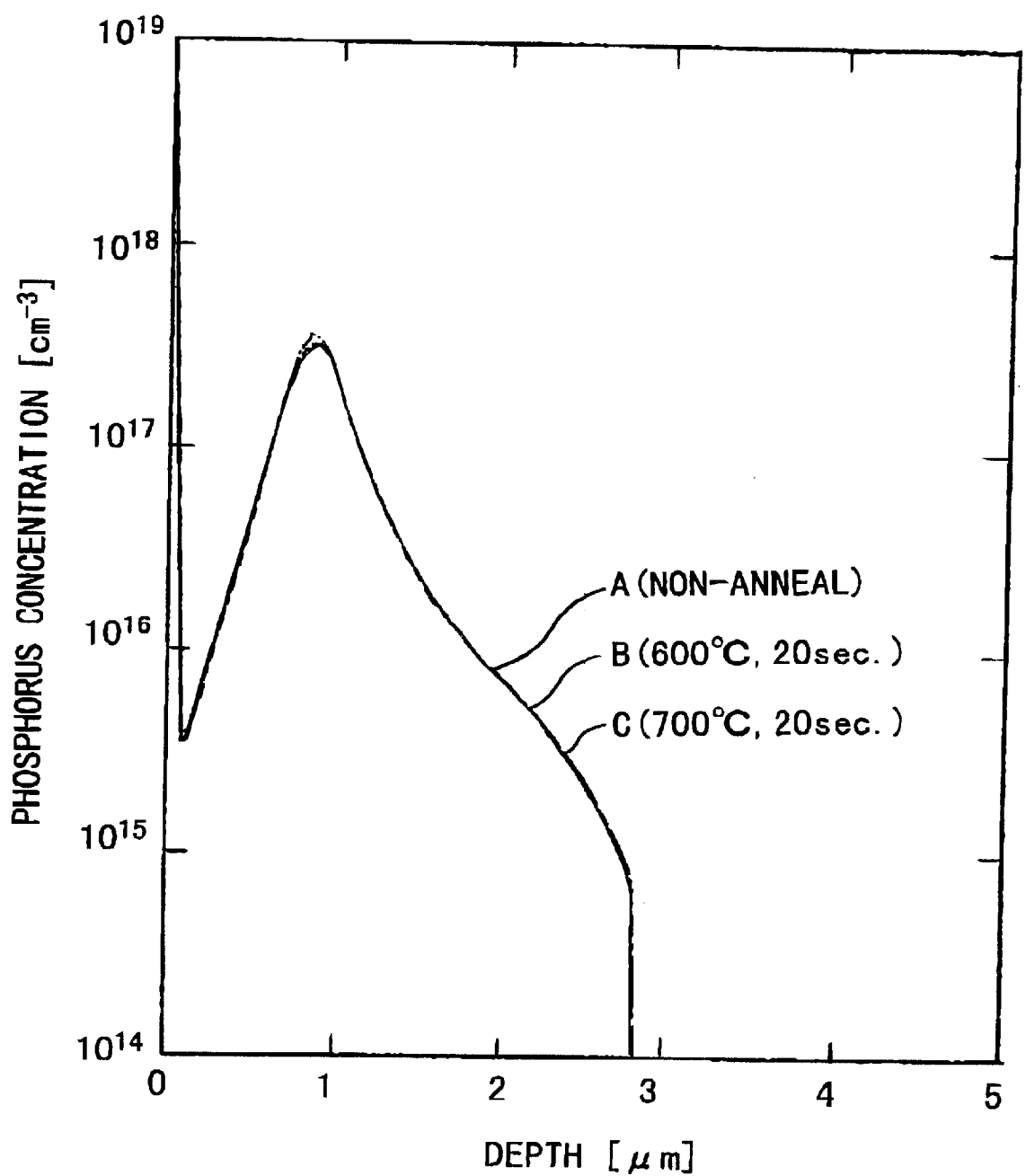
FIG. 10 is a graph showing the implanted-phosphorus concentration distribution and its change of the substrate according to the third example of the present invention as a function of the depth from the main surface of the substrate.

It was found that the epitaxial layer 2A prior to the annealing process had a phosphorus distribution shown by the curve A in FIG. 10. Also, it was found that the epitaxial layer 2B after the annealing process at a temperature of 600° C. for 20 seconds had a phosphorus distribution shown by the curve B in FIG. 10, and that the epitaxial layer 2B after the annealing process at a temperature of 700° C. for 20 seconds had a phosphorus distribution shown by the curve C in FIG. 10, both of which were approximately the same as the curve A in FIG. 10.

Fourth Example

A single-crystal Si substrate according to the present invention was fabricated in the following way.

Figure 2A:
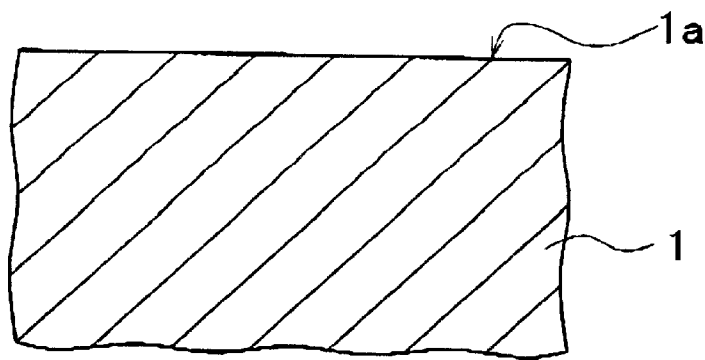
FIGS. 2A to 2D are partial, schematic cross-sectional views showing another fabrication method of a Si substrate according to the present invention, respectively, to which ion-implantation and annealing processes are added.

First, as shown in FIG. 2A, a single-crystal Si base material 1 with a plate-like shape was prepared from a single-crystal Si ingot grown according to the Czochralski method. The Si base material 1 had a flat main surface 1a on its top. It was found that the base material 1 had an oxygen concentration of $1.2 \times 10^{18}$ atoms/cm$^3$ over the whole material 1, which was a same as the first example.

Figure 2B:
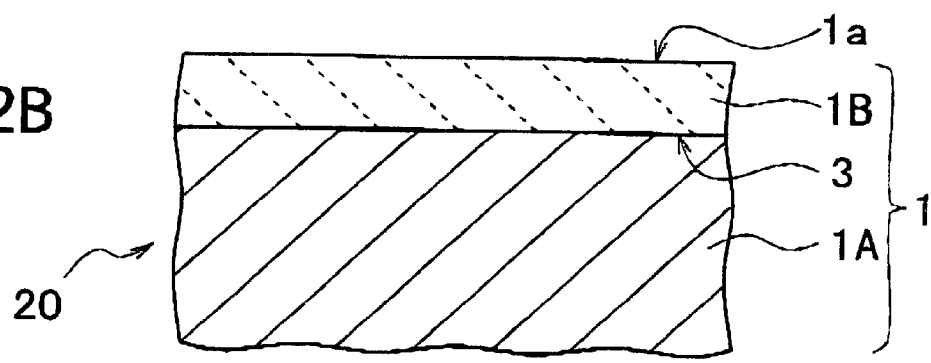

Next, the base material 1 was placed in a process chamber (not shown) supplied with a hydrogen ($H_2$) gas and held at a temperature of 1100° C. for 8 hours. Thus, oxygen existing in the vicinity of the main surface 1a of the base material 1 was partially removed due to outward diffusion, thereby forming a low oxygen-concentration layer 1B in the base material 1, as shown in FIG. 2B. The remaining part of the base material 1 became as base layer 1A.

The low oxygen-concentration layer 1B and the base layer 1A had a approximately flat interface 3.

Thus, a single-crystal Si substrate 20 according to the present invention was fabricated, as shown in FIG. 2B.

Figure 6:
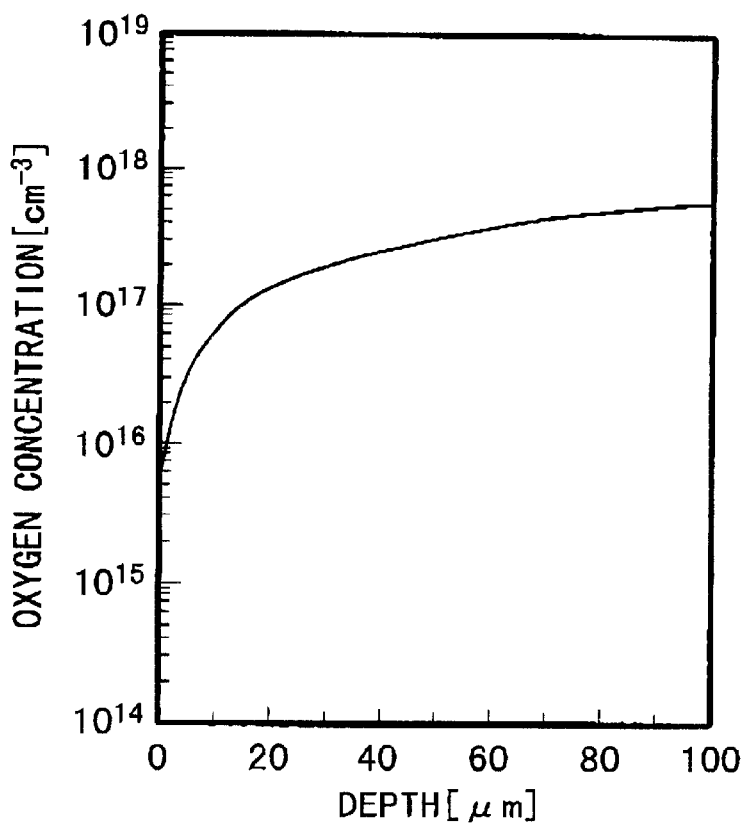
FIG. 6 is a graph showing the oxygen concentration distribution of the substrate according to a fourth example of the present invention as a function of the depth from the main surface of the substrate.

The oxygen concentration of the low oxygen-concentration layer 1B was measured by the use of a SIMS. As a result, it was found that the substrate 20 has an oxygen distribution show in FIG. 6. As seen from FIG. 6, the oxygen concentration was gradually raised toward $1.2 \times 10^{18}$ atoms/cm$^3$ with the increasing depth.

When the interface 3 was defined at a level having an oxygen concentration of $1 \times 10^{17}$ atoms/cm$^3$, the interface was located at a depth of 15 $\mu$m.

Figure 2C:
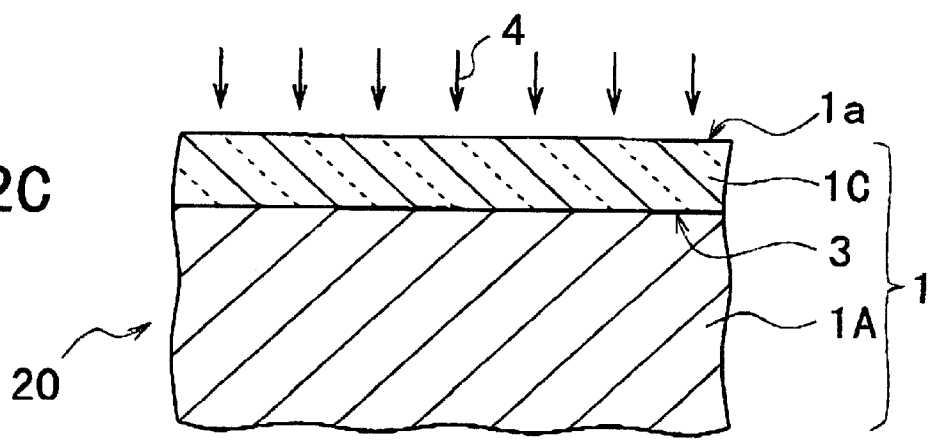

Subsequently, to confirm the advantage of the present invention, as shown in FIG. 2C, phosphorus ions ($P^+$) 4 were implanted into the low oxygen-concentration layer 1B of the substrate 20 according to the present invention under the same condition as that of the first example, thereby forming a phosphorus-doped, low oxygen-concentration layer 1C.

Figure 11:
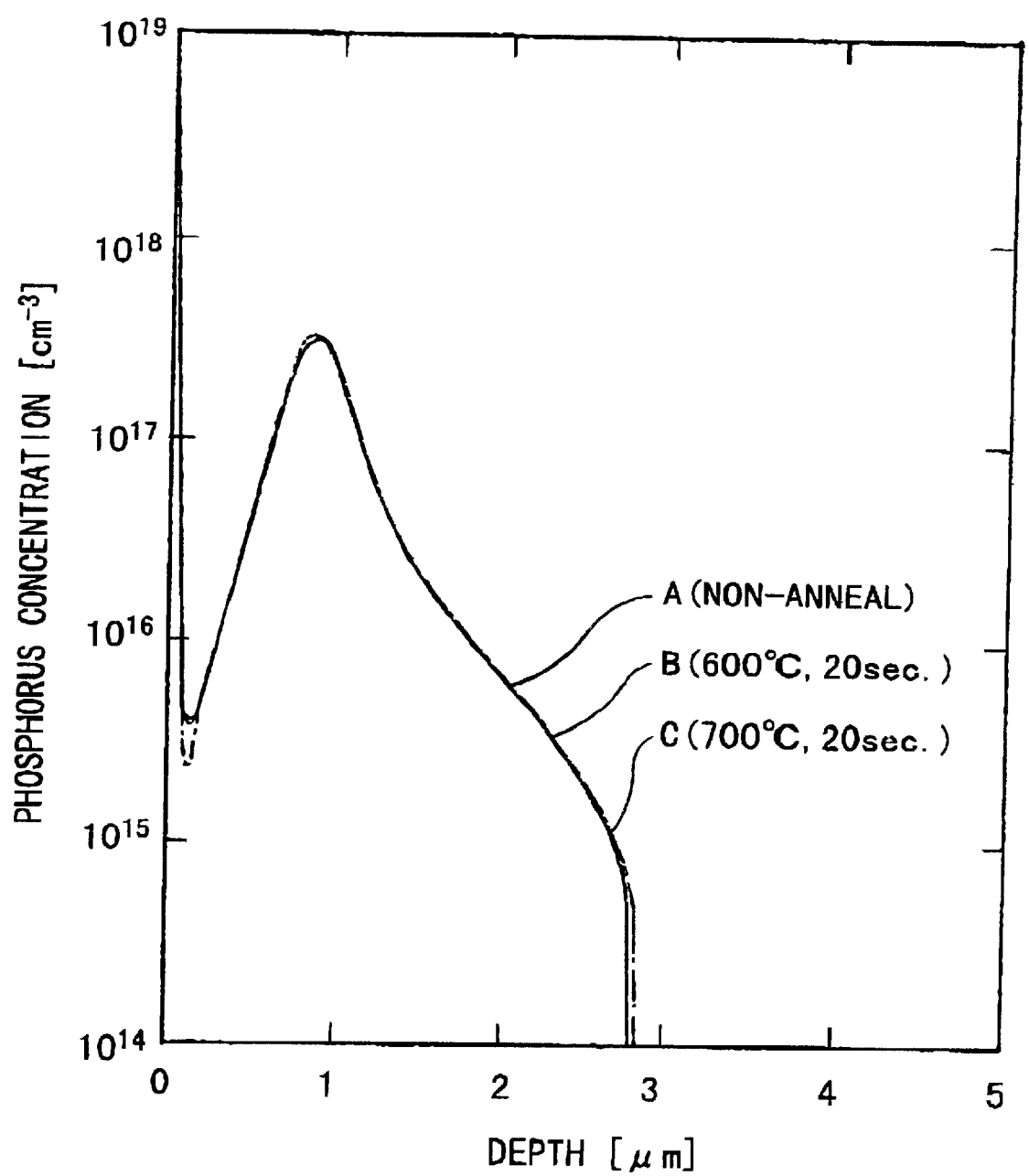
FIG. 11 is a graph showing the implanted-phosphorus concentration distribution and its change of the substrate according to the fourth example of the present invention as a function of the depth from the main surface of the substrate.

Then, the phosphorus distribution of the phosphorus-doped, low oxygen-concentration layer 1C was measured by the use of a SIMS. As a result, it was found that the low oxygen-concentration layer 1C had a phosphorus distribution shown by the curve A in FIG. 11. As seen from FIG. 11, the ion-implanted region of the low oxygen-concentration layer 1C has the maximum depth of approximately 3 $\mu$m from the main surface 1a of the base material 1.

Finally, to electrically activate the implanted phosphorus and annealing the phosphorus-implanted part of the low oxygen-concentration layer 1C, the substrate 20 was subjected to a heat treatment under the same condition as that of the first example. The annealed and phosphorus-implanted, low oxygen-concentration layer 1C was referred as 1D.

Then, the phosphorus distribution of the phosphorus-doped, low oxygen-concentration layer 1D was measured in the same way as above. As a result, it was found that the low oxygen-concentration layer 1D had a phosphorus distribution shown by the curve B in FIG. 11 for 600° C. and a phosphorus distribution shown by the curve C in FIG. 11 for 700° C., both of which were approximately the same as the curve A in FIG. 11.

Further, it was checked whether the implanted phosphorus atoms were electrically activated or not by measuring the spreading resistance of the low oxygen-concentration layer 1D. As a result, as shown in Table 1, it was found that the low oxygen-concentration layer 1D was completely annealed under all the annealing conditions that the annealing temperature was 600 or 700° C. and the annealing period was 10, 20, or 30 seconds.

Additionally, to confirm the advantage of the present invention, as shown in FIG. 2C, boron fluoride ions ($BF_2^+$) 4 as a p-type impurity were implanted into the single-crystal Si low oxygen-concentration layer 1C of the substrate 20 according to the present invention at an acceleration energy of 50 keV with a dose of $2 \times 10^{15}$ atoms/cm$^2$, thereby forming a boron-doped low oxygen-concentration layer 1C. Thus ion-implantation condition was for forming p-type well regions.

Then, the boron distribution of the born-doped low oxygen-concentration layer 1C was measured by the use of a SIMS. As a result, it was found that the low oxygen-concentration layer 1C had a phosphorus distribution shown by the curves A in FIGS. 13, 14, 15, and 16. As seen from FIG. 13, 14, 15, and 16, the ion-implanted region of the low oxygen-concentration layer 1C has the maximum depth of approximately 3 $\mu$m from the surface 1a of the substrate 20.

Figure 2D:
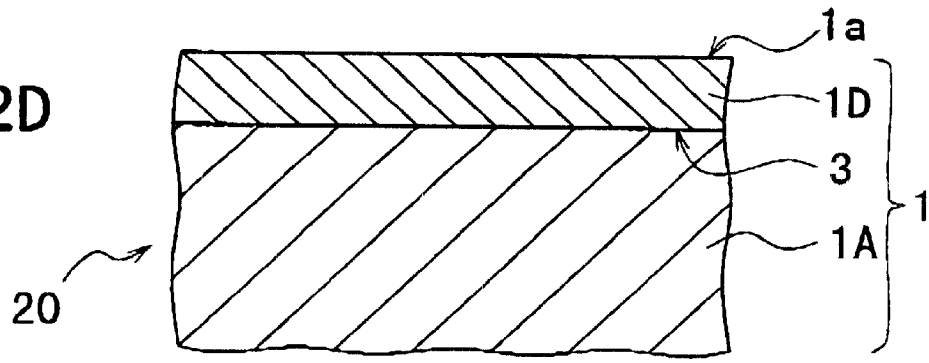

Finally, to electrically activate the implanted boron and annealing the boron-implanted part of the low oxygen-concentration layer 1C, the substrate 20 was subjected to a heat-treatment or annealing process at a temperature of 600 or 700° C. for 10, 20, or 30 seconds, as shown in FIG. 2D.

Then, the boron distribution of the annealed and boron-doped low oxygen-concentration layer 1D was measured in the same way as above. As a result, it was found that the low oxygen-concentration layer 1D had a boron distribution shown by the curve B (600° C., 20 sec) in FIG. 13, a boron distribution shown by the curve B (700° C., 20 sec) in FIG. 14, a boron distribution shown by the curve B (800° C., 20 sec) in FIG. 15, a boron distribution shown by the curve B (900° C., 20 sec) in FIG. 16.

Figure 13:
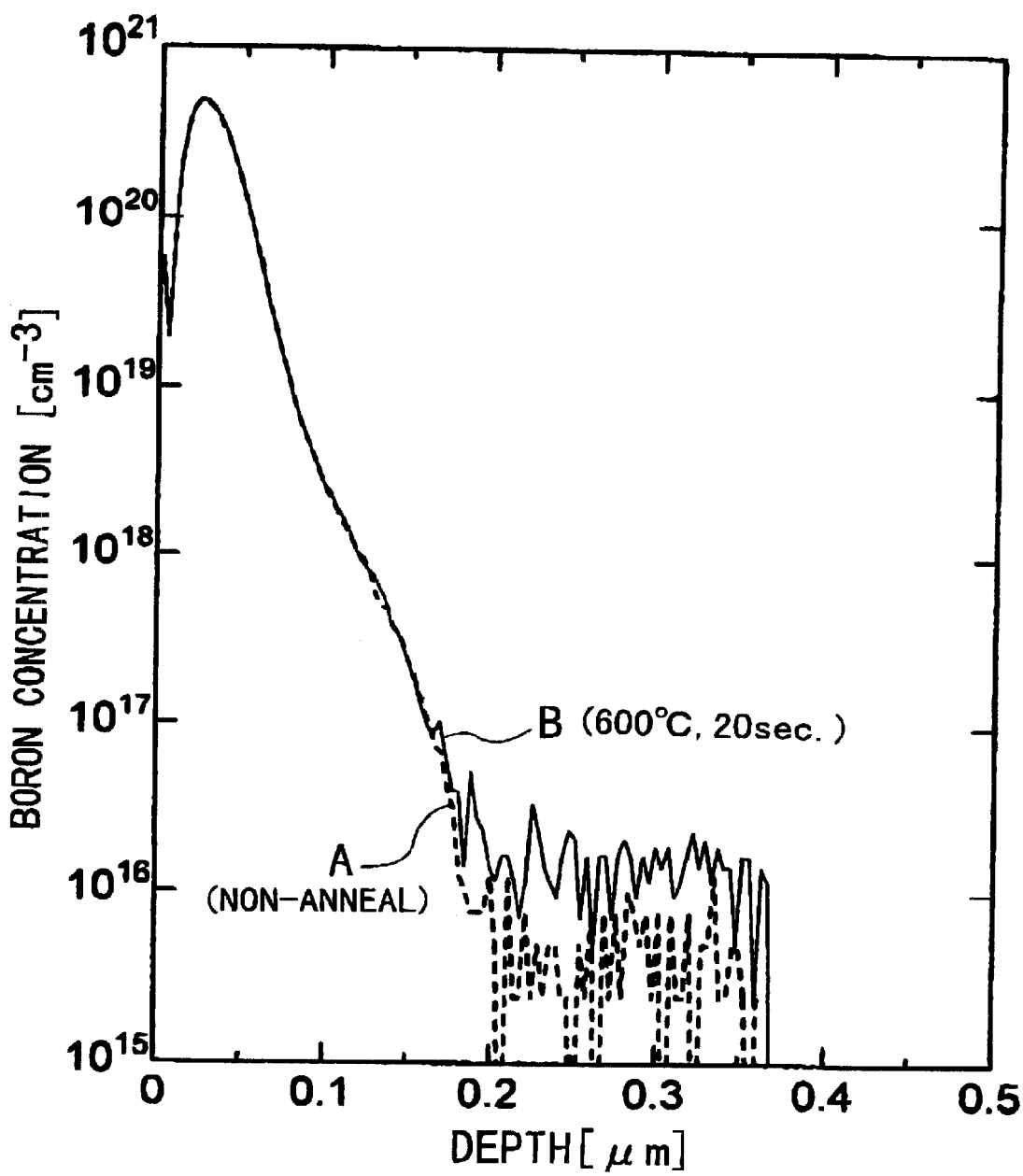
FIG. 13 is a graph showing the implanted-boron concentration distribution and its change of the substrate according to the first example of the present invention as a function of the depth from the main surface of the substrate.
Figure 14:
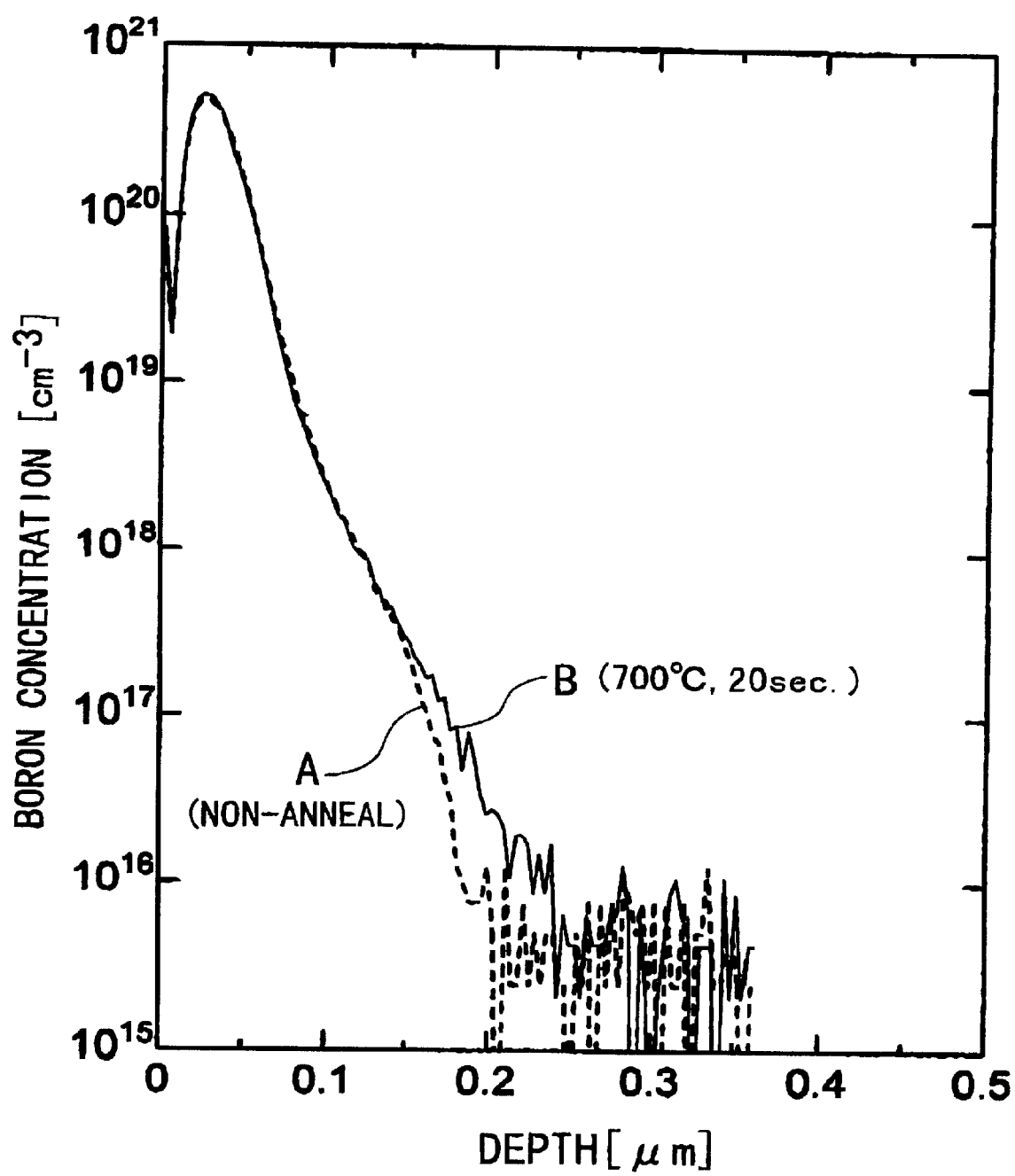
FIG. 14 is a graph showing the implanted-boron concentration distribution and its change of the substrate according to the second example of the present invention as a function of the depth from the main surface of the substrate.
Figure 15:
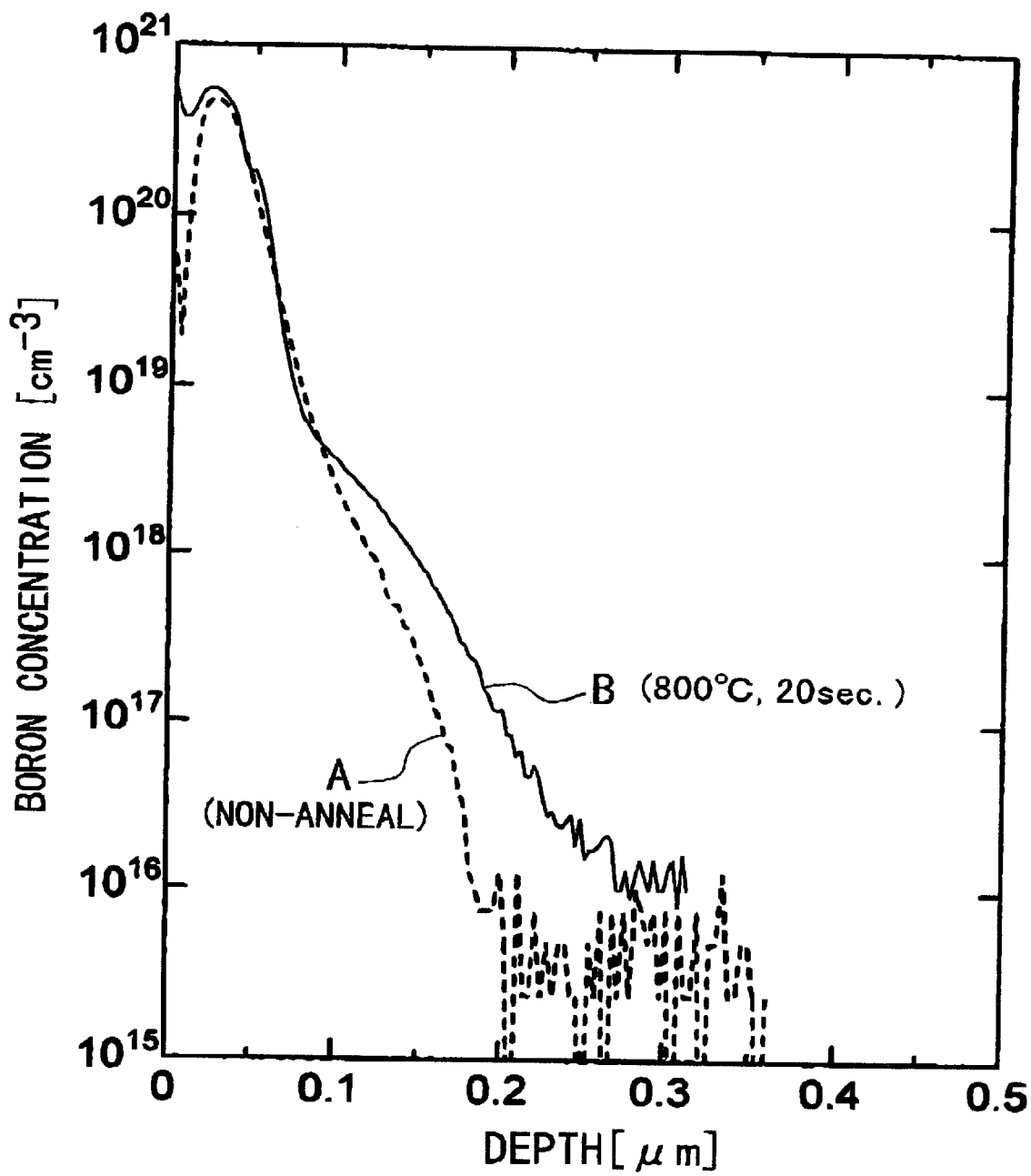
FIG. 15 is a graph showing the implanted-boron concentration distribution and its change of the substrate according to the third example of the present invention as a function of the depth from the main surface of the substrate.
Figure 16:
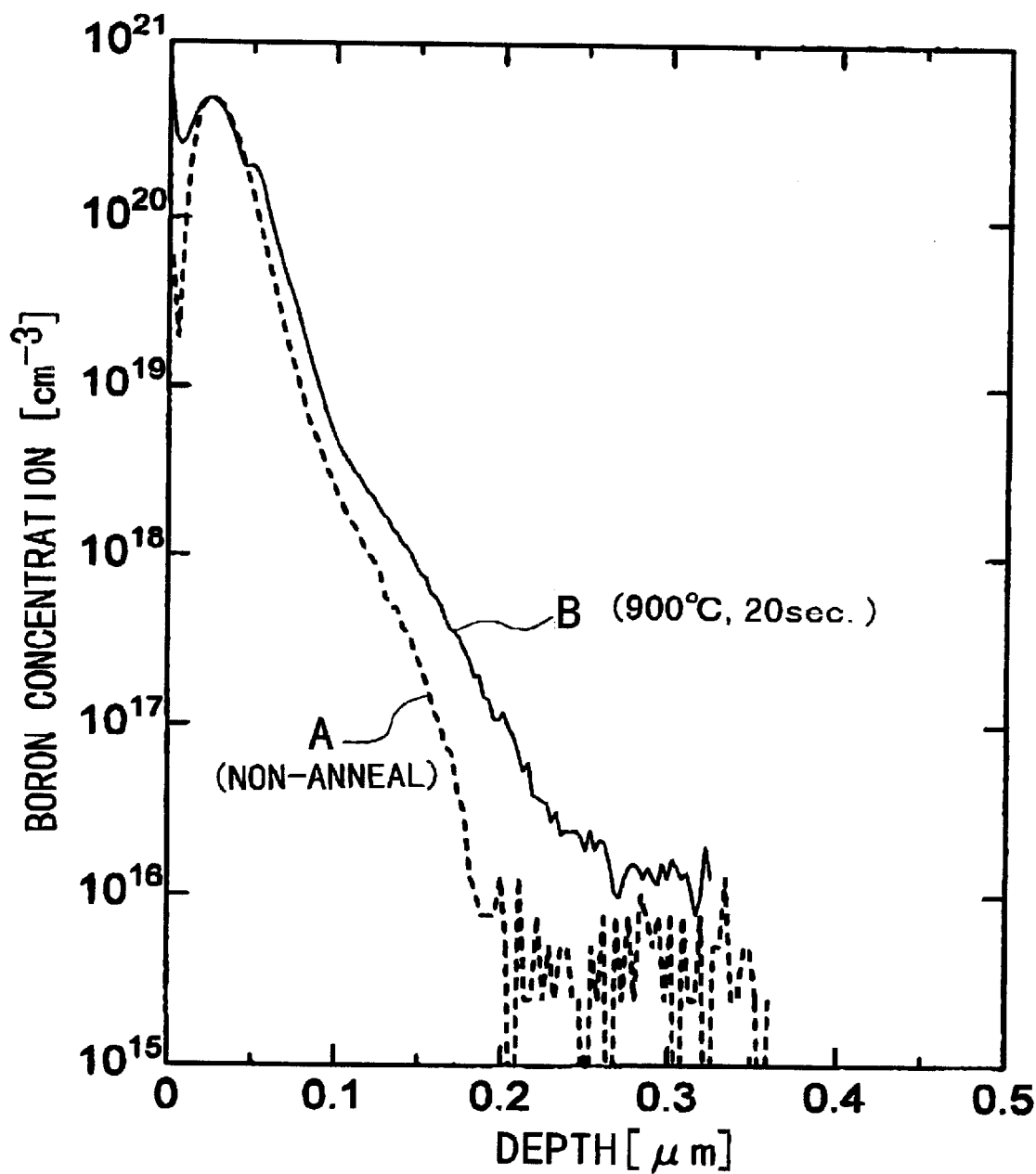
FIG. 16 is a graph showing the implanted-boron concentration distribution and its change of the substrate according to the fourth example of the present invention as a function of the depth from the main surface of the substrate.

It is seen from the curves B in FIGS. 13 and 14 that the diffusion length of the introduced boron is not changed and as a result, the concentration and profile of the doped boron are not substantially changed. Also, it is seen from the curves B in FIGS. 15 and 16 that the diffusion length of the introduced boron is widely changed and as a result, the concentration and profile of the doped boron are substantially changed.

Thus, by setting the annealing temperature to be lower than 700° C., the diffusion of the introduced boron an be prevented.

Comparative Example

A conventional, single-crystal Si substrate (not shown) was actually fabricated in the same way as described in the first example except that the epitaxial layer 2 was not grown. In other words, the single-crystal Si base material 1 shown in FIG. 1A was used without the epitaxial layer 2.

Then, phosphorus-ion implantation and annealing processes were performed to the conventional substrate in the same way as those of the first example.

Figure 7:
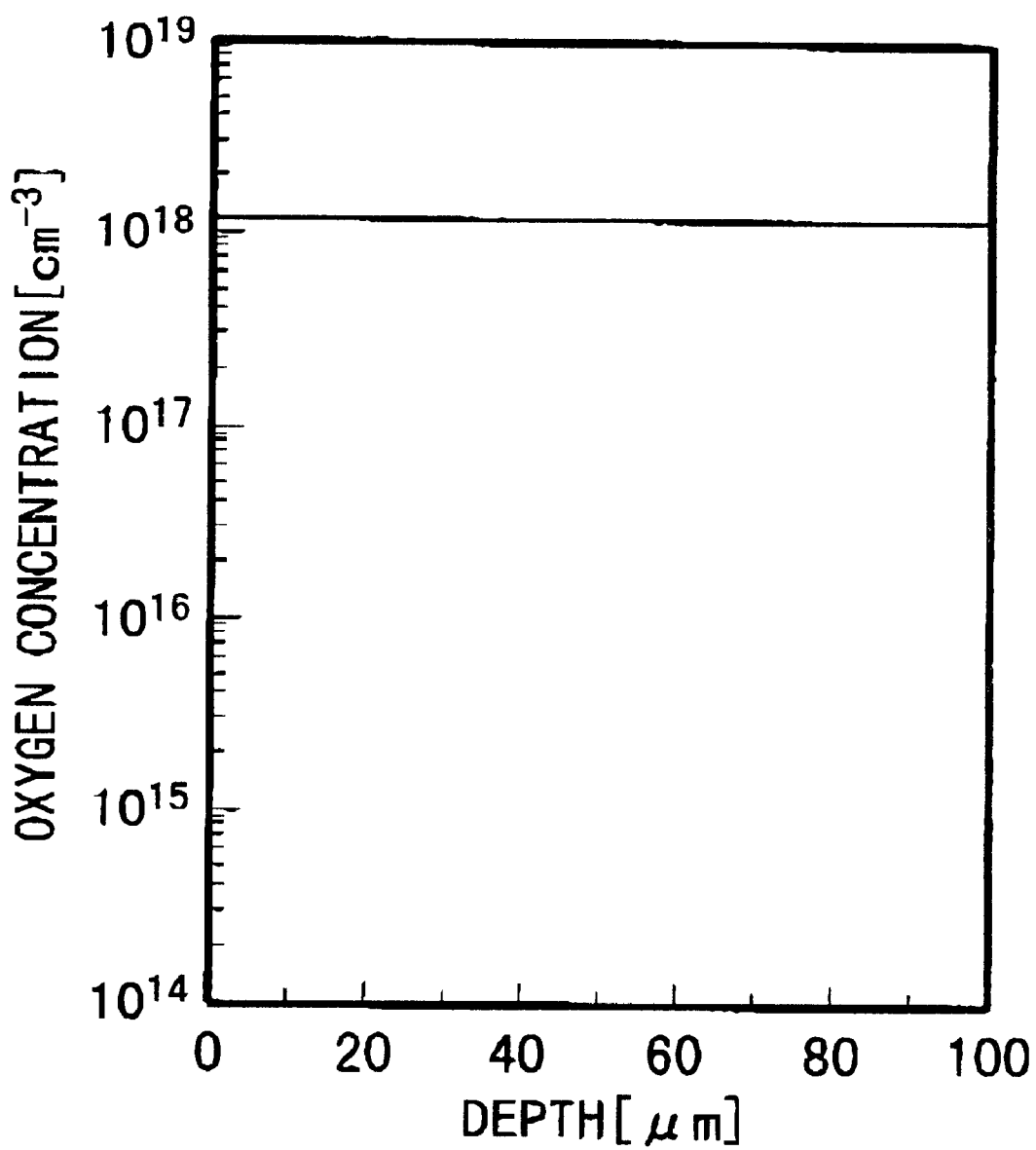
FIG. 7 is a graph showing the oxygen concentration distribution of the conventional substrate as a function of the depth from the main surface of the substrate.

As a result, it was found that the base material or substrate 1 had an oxygen concentration of $1.2 \times 10^{18}$ atoms/cm$^3$, as shown in FIG. 7, which is constant independent of the depth.

Figure 12:
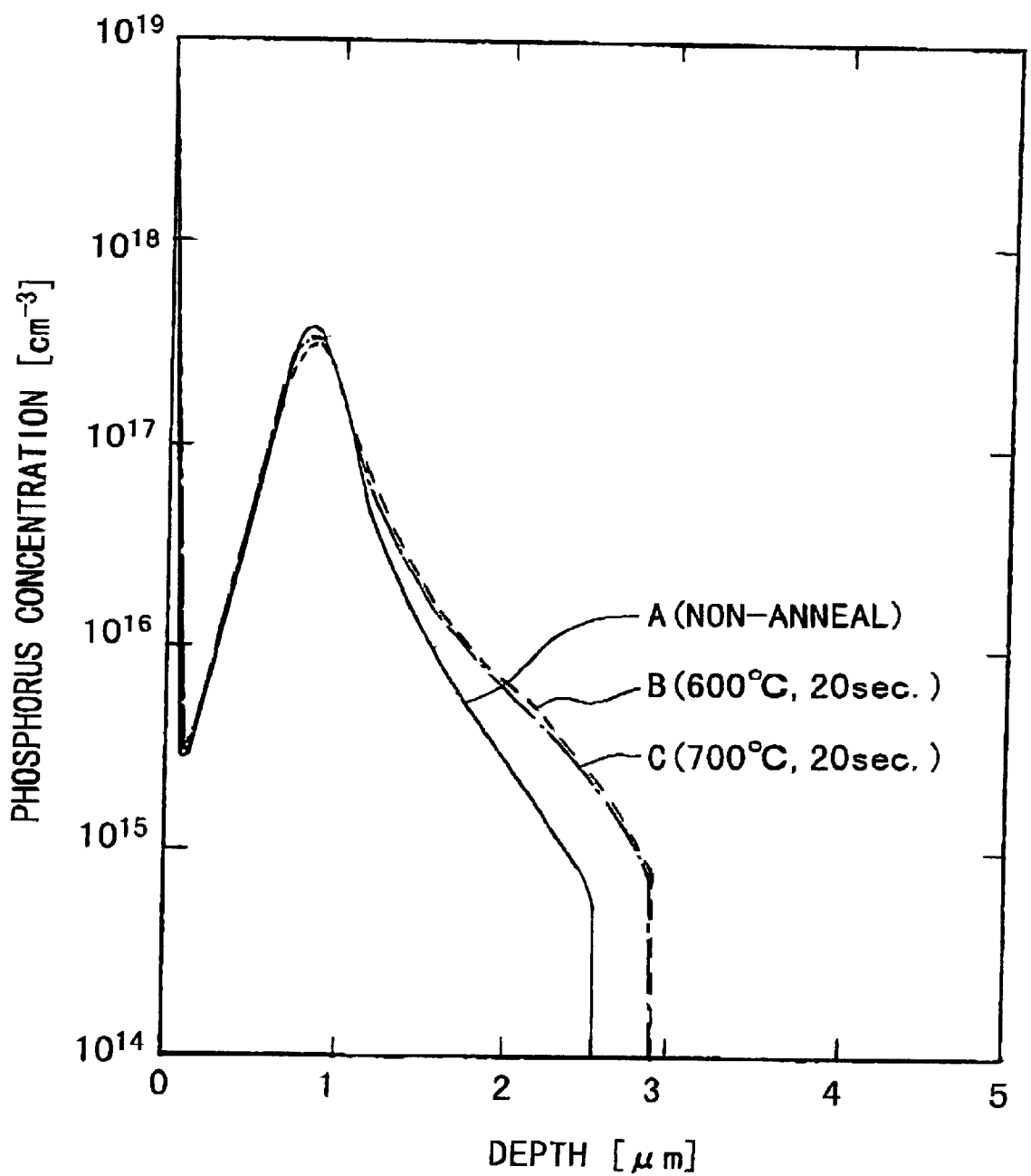
FIG. 12 is a graph showing the implanted-phosphorus concentration distribution and its change of the conventional substrate as a function of the depth from the main surface of the substrate.

It was found that the conventional substrate prior to the annealing process had a phosphorus distribution shown by the curve A in FIG. 12. Also, it was found that the conventional substrate after the annealing process at a temperature of 600° C. for 20 seconds had a phosphorus distribution shown by the curve B in FIG. 12, an that the conventional substrate after the annealing process at a temperature of 700° C. for 20 seconds had a phosphorus distribution shown by the curve C in FIG. 12, both of which were quite different from the curve A in FIG. 12.

This means that the concentration and profile of the implanted phosphorus were changed within a comparatively wide range in the comparative example. In other words, the concentration and profile of the doped phosphorus were widely changed in the comparative example.

Phosphorus and boron are used in the above-described examples. However, it is needless to say that any other impurity may be used for the present invention.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a silicon substrate, comprising the steps of:

(a) preparing a single-crystal Si base material with a flat main surface;

said base material having a first oxygen concentration;

(b) growing a single-crystal Si epitaxial layer on said main surface of said base material in such a way that said epitaxial layer has a second oxygen concentration lower than said first oxygen concentration;

(c) ion implanting dopant atoms into the epitaxial layer; and (d) controlling a concentration of the dopant atoms in the epitaxial layer when activating the implanted dopant atoms by activating the implanted dopant atoms at a temperature lower than 700° C. with one of heat treatment and annealing, whereby a diffusion length of the dopant atoms is reduced and a concentration of the dopant is controlled.

2. The method as claimed in claim 1, wherein said second oxygen concentration of said epitaxial layer is equal to $1\times10^{17}$ atoms/cm$^3$ or lower.

3. The method as claimed in claim 1, wherein said epitaxial layer has a thickness ranging from 5 $\mu$m to 20 $\mu$m.

4. A method of controlling a concentration of a dopant in a single crystal silicon substrate, the method comprising the steps of:

providing a single crystal silicon substrate having a first oxygen concentration and a first surface;

forming a lower oxygen concentration layer by growing a single crystal silicon epitaxial layer on the first surface, the epitaxial layer having a second oxygen concentration that is lower than the first oxygen concentration;

ion implanting dopant atoms into the epitaxial layer; and controlling a concentration of the dopant atoms in the epitaxial layer when activating the implanted dopant atoms by activating the implanted dopant atoms at a temperature lower than 700° C. with one of heat treatment and annealing, whereby a diffusion length of the dopant atoms is reduced and a concentration of the dopant is controlled.

5. The method of claim 4, wherein the step of controlling the concentration of the dopant atoms includes the step of activating the implanted dopant atoms at a temperature lower than 700° C. for no more than several seconds.

6. The method of claim 4, wherein the second oxygen concentration is less than or equal to $1\times10^{17}$ atoms/cm$^3$.

7. The method of claim 4, wherein said epitaxial layer has a thickness of 5 $\mu$m to 20 $\mu$m.

* * * * *